United States Patent
Ju et al.

(10) Patent No.: US 8,233,284 B2
(45) Date of Patent: Jul. 31, 2012

(54) GROUNDING STRUCTURE AND ELECTRICAL DEVICE

(75) Inventors: Ted Ju, Keelung (TW); Chien-Chih Ho, Keelung (TW)

(73) Assignee: Lotes Co., Ltd., Keelung (TW)

( * ) Notice: Subject to any disclaimer, the term of this patent is extended or adjusted under 35 U.S.C. 154(b) by 281 days.

(21) Appl. No.: 12/699,344

(22) Filed: Feb. 3, 2010

(65) Prior Publication Data

US 2011/0188216 A1 Aug. 4, 2011

(51) Int. Cl.
*H05K 9/00* (2006.01)
(52) U.S. Cl. .......... 361/753; 361/799; 174/32; 439/73
(58) Field of Classification Search .......... 361/753, 361/799, 807; 439/607.01, 73; 174/32
See application file for complete search history.

(56) References Cited

U.S. PATENT DOCUMENTS

| 5,730,620 | A  | * | 3/1998 | Chan et al. ............. | 439/526 |
| 6,930,884 | B2 | * | 8/2005 | Cromwell et al. ......... | 361/710 |
| 7,697,296 | B2 | * | 4/2010 | Floyd et al. ............ | 361/719 |

FOREIGN PATENT DOCUMENTS

TW 275560 Y 11/2005

\* cited by examiner

*Primary Examiner* — Dameon Levi
(74) *Attorney, Agent, or Firm* — Rosenberg, Klein & Lee

(57) ABSTRACT

A grounding structure, for connecting to an opposite connecting electrical device with a metal casing, is assembled on a circuit board having at least one grounding component. The grounding structure includes a conductive mechanism electrically connected to the metal casing of the opposite connecting electrical device; and at least one conductive pad, disposed between the conductive mechanism and the circuit board, and contacting the conductive mechanism and the grounding component of the circuit board. The grounding structure of the invention can transmit the disturbance to be advantageous for signal transmitting between the opposite connecting electrical device and the circuit board.

17 Claims, 6 Drawing Sheets

GROUNDING STRUCTURE AND ELECTRICAL DEVICE

BACKGROUND OF THE INVENTION

1. Field of the Invention

The invention relates to a grounding structure, and more particularly, the invention relates to a grounding structure of an electrical device.

2. Description of the Prior Art

Taiwan Patent No. 093219038 disclosed an electrical connecting device including an insulating main body, a plurality of conductive terminals disposed on the insulating main body, a bracing sheet disposed around the circumference of the insulating main body, a pressing plate pressing on the insulating main body, and a stirring rod. A plurality of assembling holes is disposed on the bracing sheet. The electrical connecting device further includes a plurality of insulating washers assembled in the assembling holes and a plurality of screw bolts pass through the assembling holes. The insulating washer protrudes from the assembling hole to the place between the bracing sheet and the circuit board, and the screw bolt passes through the assembling hole to fix the bracing sheet on the circuit board. However, when the chip module with a metal casing is assembled between the pressing plate and the bracing sheet, a connecting device with fine grounding effect is needed for grounding the chip module and the circuit board.

SUMMARY OF THE INVENTION

A scope of the invention is to provide a grounding structure capable of transmitting the disturbance.

For the above-mentioned purpose, the grounding structure of the invention is used for connecting an opposite connecting electrical device having a metal casing, and the grounding structure is assembled on a circuit board having at least one grounding component. The grounding structure includes: a conductive mechanism electrically connected to the metal casing of the opposite connecting electrical device; and at least one conductive pad disposed between the conductive mechanism and the circuit board, wherein the conductive pad contacts the conductive mechanism and the grounding component of the circuit board.

Another scope of the invention is to provide an electrical device having a grounding structure capable of transmitting the disturbance out of the opposite connecting electrical device to be advantageous for signal transmitting between the opposite connecting electrical device and the circuit board.

For the above-mentioned purpose, the electrical device of the invention includes: a circuit board, having at least one grounding component; an electrical connector, assembled on the circuit board; a conductive mechanism, disposed around the electrical connector; and at least one conductive pad, disposed between the conductive mechanism and the circuit board, wherein the conductive pad contacts the conductive mechanism and the grounding component of the circuit board.

Compared to the prior art, the grounding structure and the electrical device have the conductive mechanism electrically connected to the metal casing of the opposite connecting electrical device, and the conductive pad contacting the conductive mechanism and the grounding component of the circuit. Therefore, the disturbance of the opposite connecting electrical device can be transmitted to the grounding component of the circuit board through the conductive mechanism and the conductive pad in sequence, so as to prevent the normal signal transmission between the opposite connecting electrical device and the circuit board from the disturbance.

These and other features, aspects, and advantages of the present invention will become better understood with regard to the following description, appended claims, and accompanying drawings.

BRIEF DESCRIPTION OF THE APPENDED DRAWINGS

FIG. 4 is a sectional view illustrating the opposite connecting electrical device in

Figure 1:
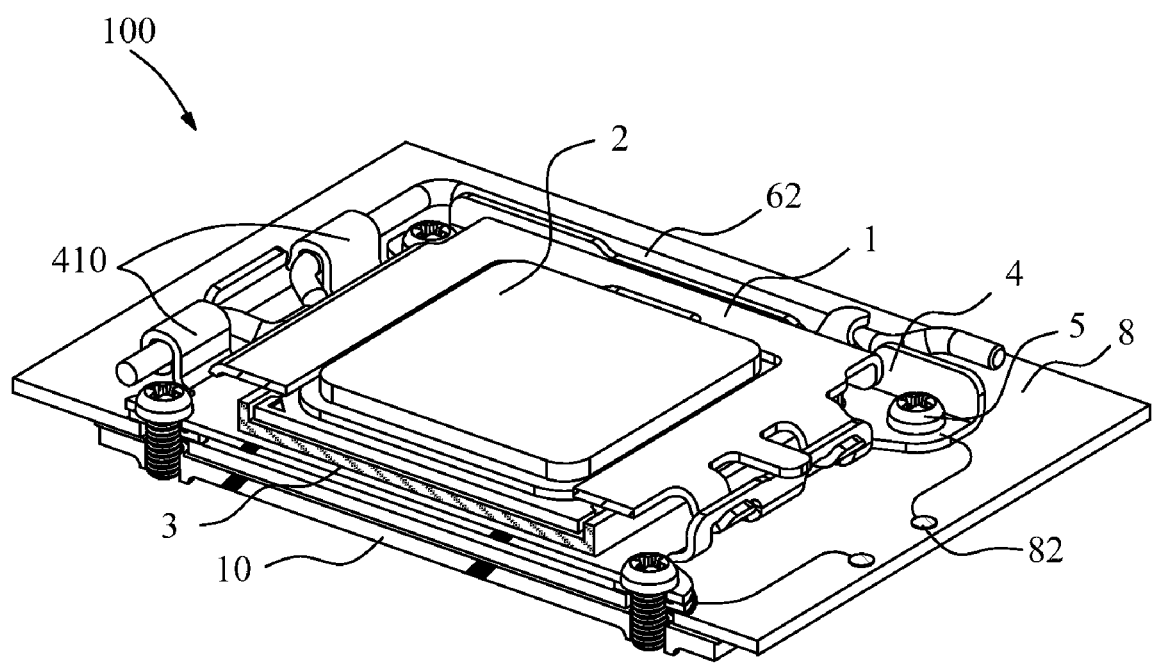
FIG. 1 is an assembly drawing illustrating the electrical device of the invention.
Figure 2:
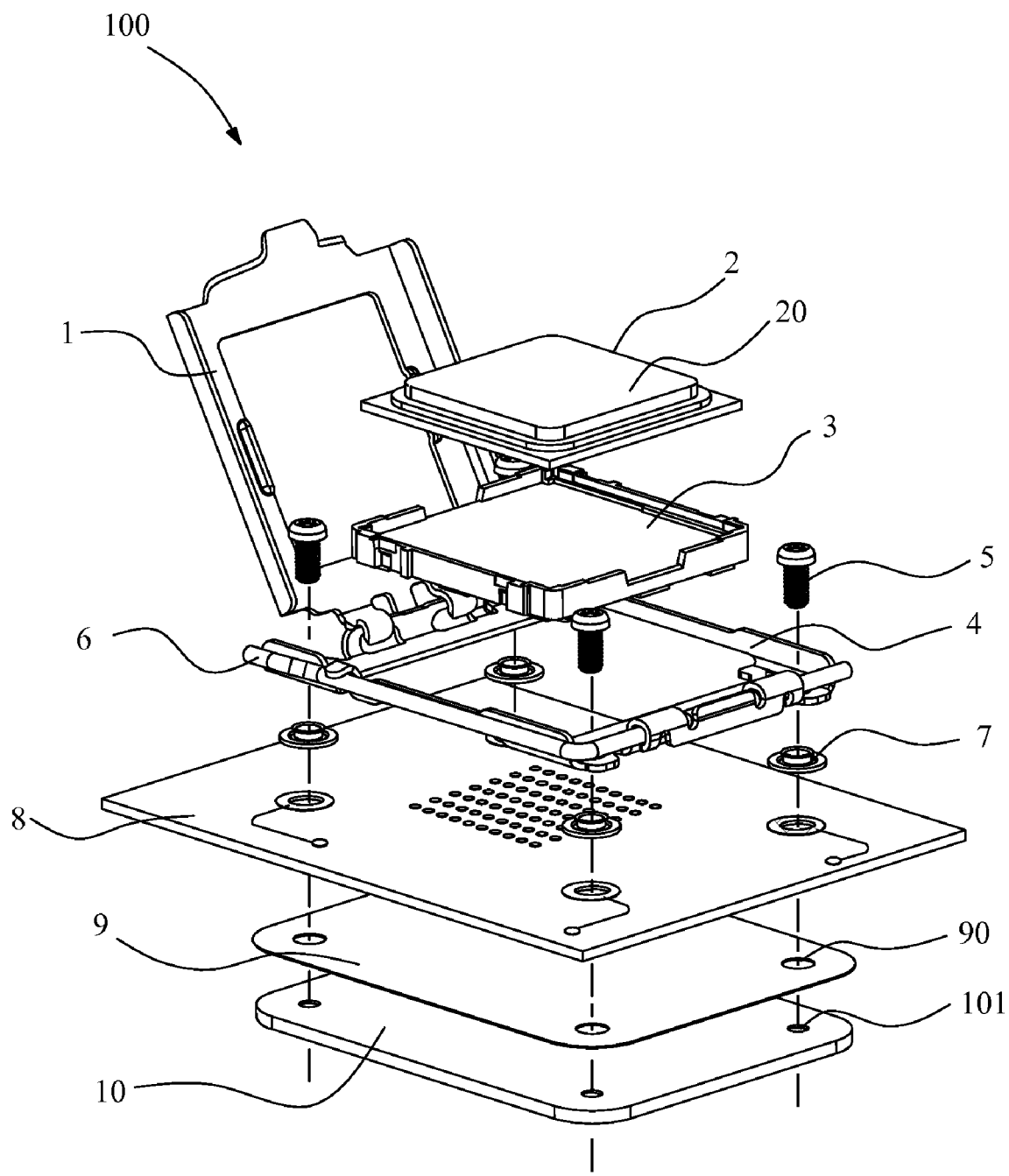
FIG. 2 is an exploded drawing illustrating the electrical device in FIG. 1.
Figure 5:
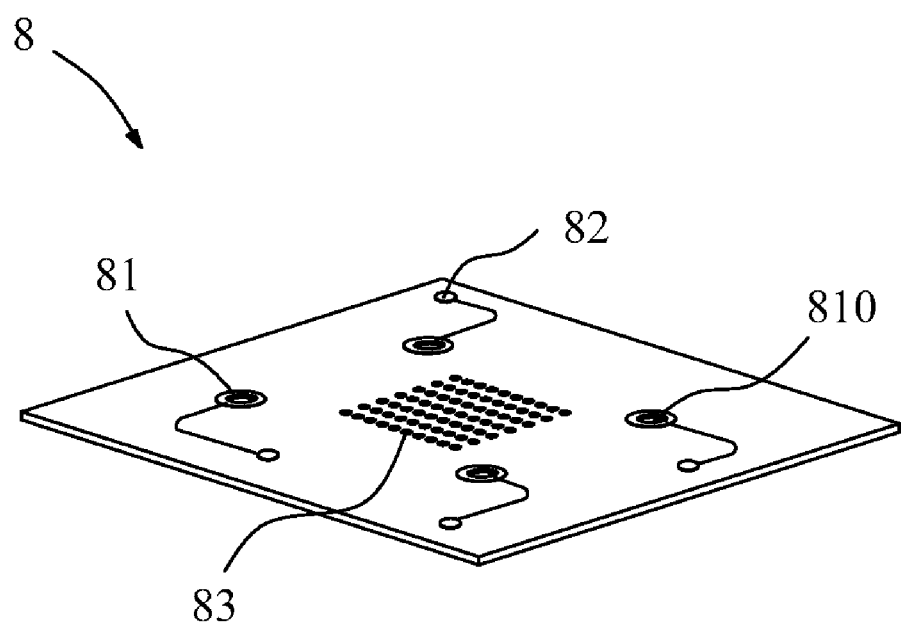
Figure 6:
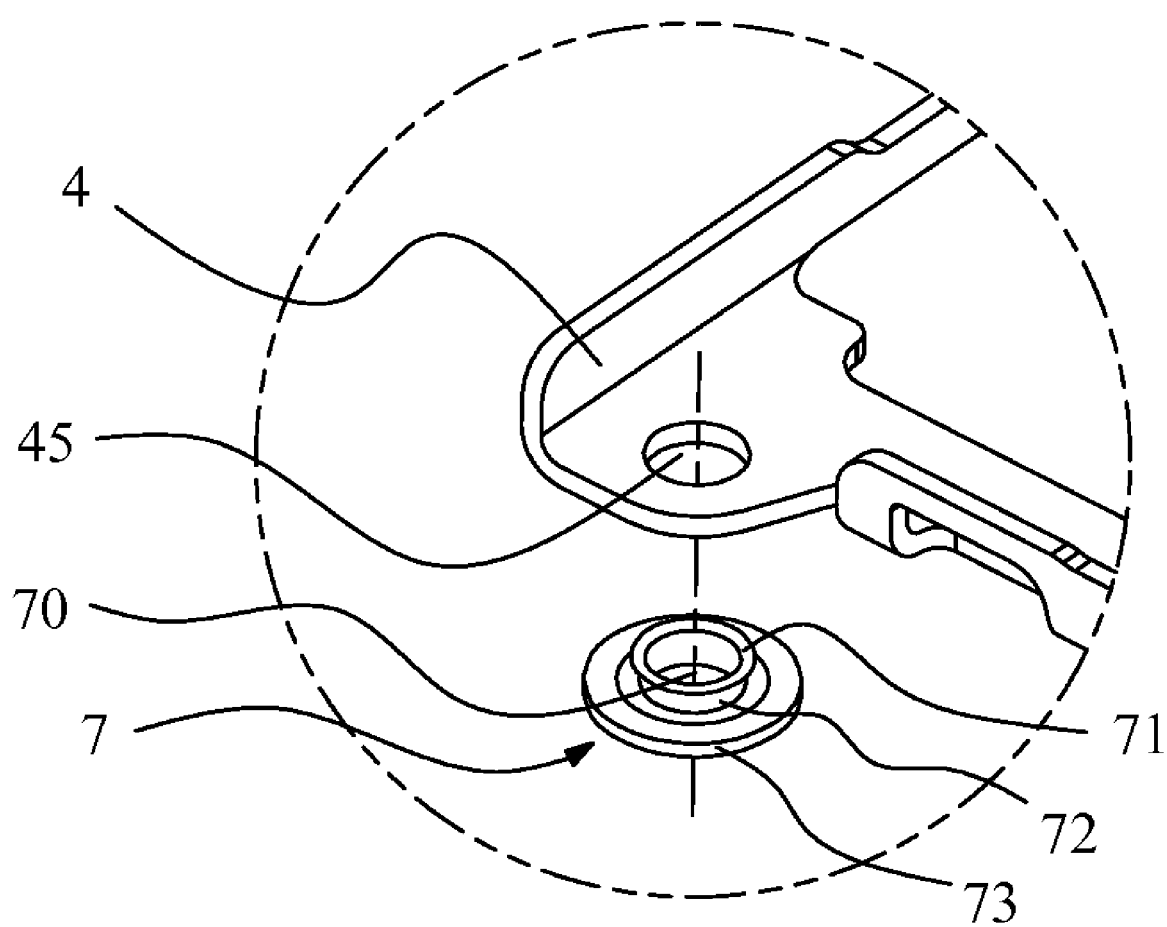
Figure 7:
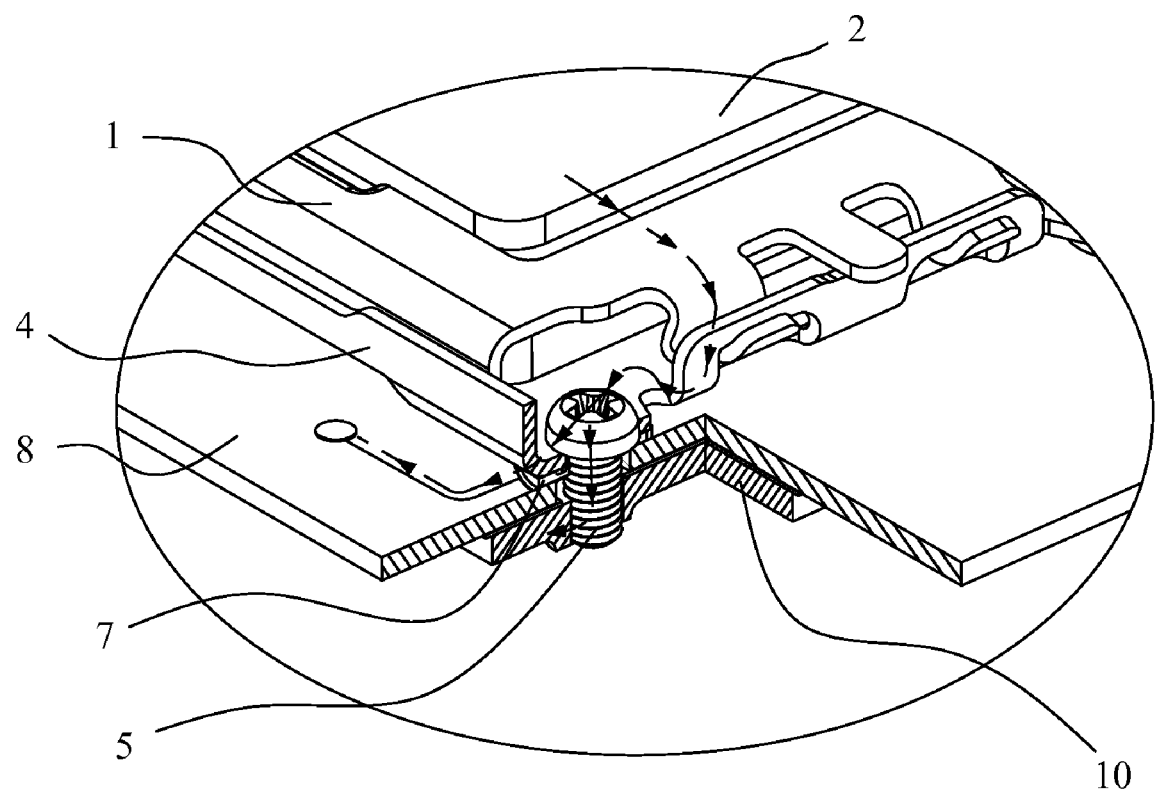

FIG. 2;

FIG. 5 is a schematic drawing illustrating the circuit board in FIG. 2;

FIG. 6 is an assembly drawing illustrating the conductive pad and the fixing base in FIG. 2;

FIG. 7 is a partial sectional view illustrating the electrical device in FIG. 1.

DETAILED DESCRIPTION OF THE INVENTION

The grounding structure and the electrical device of the invention will be described in detail in the following embodiments and the figures.

Figure 3:
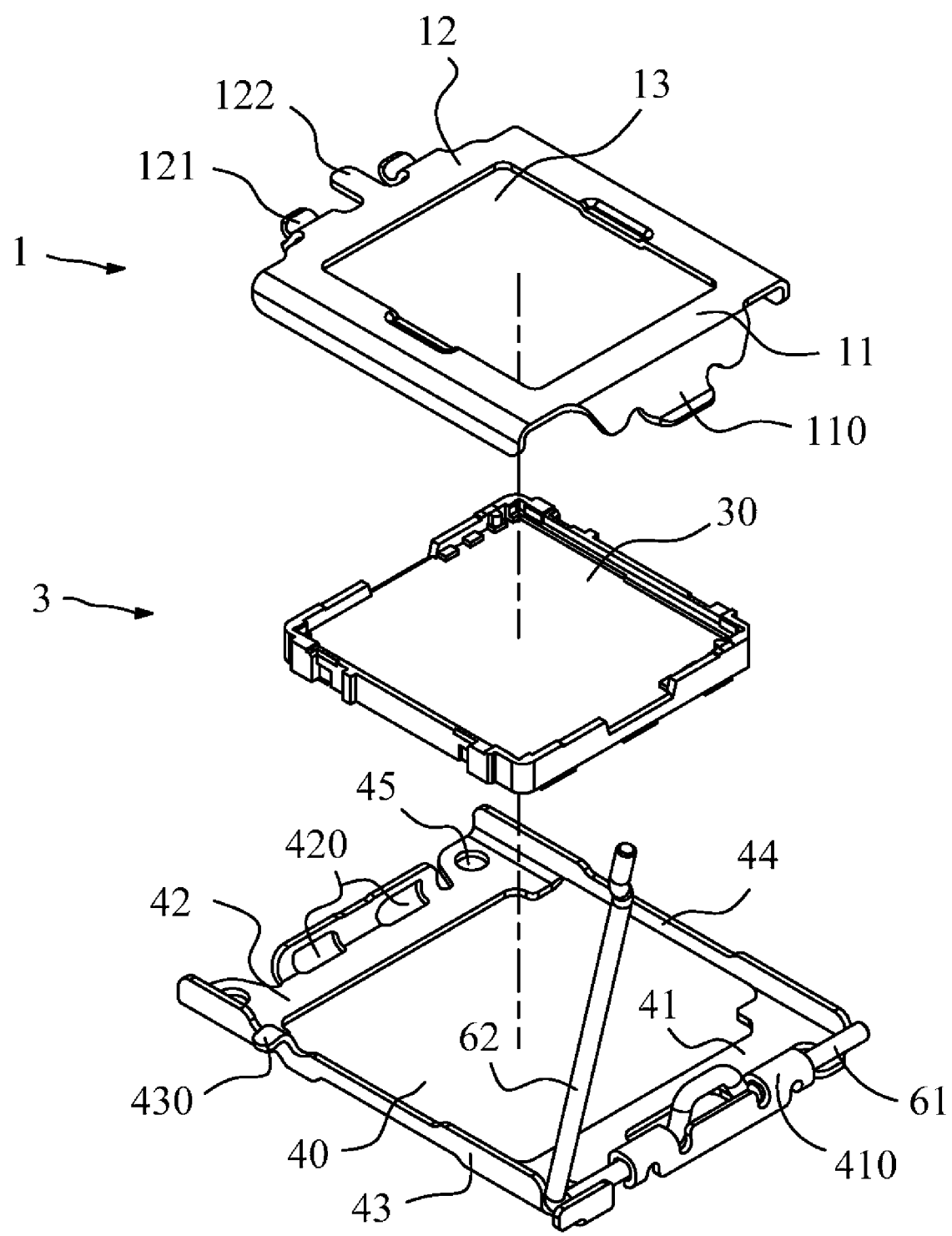
FIG. 3 is an exploded drawing illustrating parts of the electrical device in FIG. 2 from another view point.

Please refer to FIG. 1 to FIG. 3. The electrical device 100 includes an opposite connecting electrical device 2, a circuit board 8, an electrical connector disposed on the circuit board 8, and a grounding structure for fixing the opposite connecting electrical device 2 on the circuit board 8. The grounding structure includes a conductive mechanism and a plurality of conductive pads 7 disposed between the conductive mechanism and the circuit board 8.

An insulating film 9 and a metal back plate 10 are located in sequence on another side opposite to the side where the electrical connector is disposed of the circuit board 8. A plurality of connecting components 5 cooperate with the conductive pads 7 to connect the conductive mechanism, the circuit board 8, the insulating film 9, and the metal back plate 10 to form a unity. Certainly, the connecting components 5, the insulating film 9, and the metal back plate 10 can be regarded as the compositions of the electrical device 100.

Figure 4:
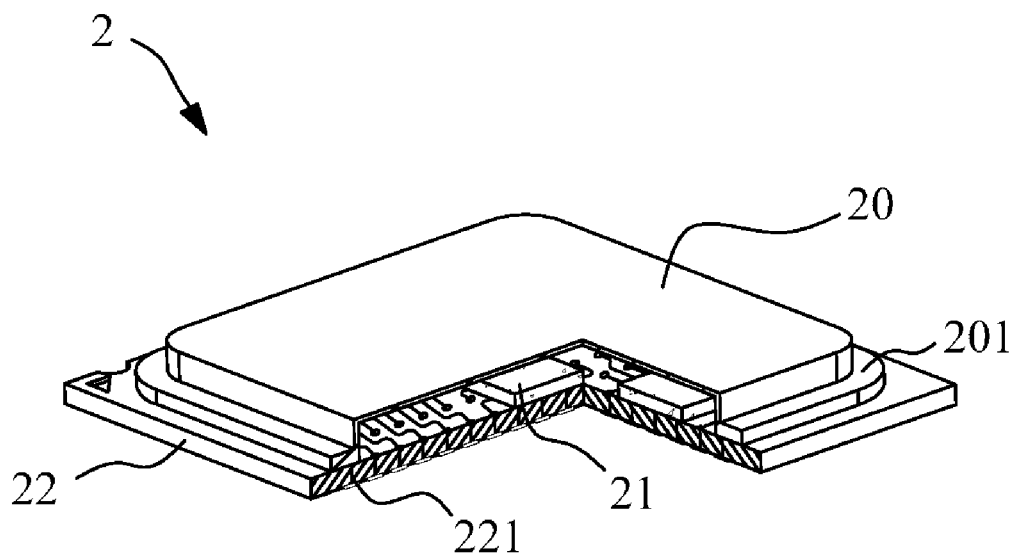

In this embodiment, the opposite connecting electrical device 2 is the chip module 2. As shown in FIG. 4, the chip module 2 has a metal casing 20, a substrate 22, and a plurality of electrical components 21. The circumference 201 of the metal casing 20 is connected to the substrate 22, and the electrical components 21 are disposed between the metal casing 20 and the substrate 22. The substrate 22 has a plurality of lines thereon, and generally, the lines include the signal transmission lines, the power lines, and the grounding lines 221. In this embodiment, particularly, the grounding lines 221 are connected to the circumference 201 of the metal casing 20.

The electrical connector includes an insulating main body 3 carrying the opposite connecting electrical device 2, and several terminals (not shown in the figures) contained in the insulating main body 3. The insulating main body 3 is rectangular and flat, and it is located below the chip module 2. The middle of the insulating main body 3 is conductive area 30 with terminal containers (not shown in the figures), arranged in a matrix, corresponding to the terminals (not shown in the figures). Each terminal container contains one corresponding terminal. The terminals are electrically connected to the chip module 2 and the circuit board 8.

Please refer to FIG. 1 to FIG. 3. The conductive mechanism includes a first metal component and a second metal component. The first metal component is a metal fixing apparatus and the second metal component is a metal plate 1. The metal fixing apparatus includes a fixing base 4 disposed around the circumference of the insulating main body 3, and a stirring rod 6 for combining the metal plate 1 and the fixing base 4. The metal plate 1, the metal fixing apparatus, and the conductive pads 7 can be regarded as a buckle.

The metal plate 1 is a hollow frame, and the middle of the metal plate 1 forms an opening 13. The metal plate 1 is formed by four sides, wherein two opposite sides are the first side 11 and the second side 12 respectively. When the metal plate 1 covers the chip module 2, the opening 13 contains the protruding part of the middle of the chip module 2. The four sides can be used for contacting the circumference 201 of the metal casing 20 of the chip module 2. The middle of the first side 11 protrudes to form a curving match part 110, and the second side 12 symmetrically protrudes to form two buckling parts 121 with semicircular sections. A pulling part 122, which is substantially striped, is protruded from the place between the two buckling parts 121, and the pulling part 122 is used for easily lift the metal plate 1 up.

The fixing base 4 is made of a metal material with high strength. The fixing base 4 is a hollow frame, that is, the middle of the fixing base 4 is a hollow part 40, and around the hollow part 40 are four edges. The second edge 42 of the four edges is corresponding to the buckling parts 121. The second edge 42 has two buckling opening 420 respectively corresponding to one of the buckling parts 121. The first edge 41 is opposite to the second edge 42, and the middle of the first edge 41 protrudes backward the hollow part 40 to form two curved part 410. The third edge 43 and the fourth edge 44 are perpendicular to the first edge 41. The third edge 43 protrudes backward the hollow part 40 to form two locking part 430. A assembling hole 45 is disposed at each of four corners of the fixing base 4, that is, the first edge 41 and the second edge 42 respectively have two assembling holes 45. The fixing base 4 is carried and disposed around the insulating main body 3, and the hollow part 40 is corresponding to the conductive area 30 of the insulating main body 3.

The stirring rod 6 has a pushing part 61 and an operating part 62 for driving the electrical device 100 in an open or close state. The pushing part 61 is substantially perpendicular to the operating part 62, and the pushing 61 is contained in the two curved parts 410 of the metal plate 1. When the stirring rod 6 is driven to make the electrical device 100 closed, the operating part 62 is fixed on the locking part 430 of the metal plate 1, and the pushing part 61 of the stirring rod 6 forces the match part 110 of the metal plate 1 to press the chip module 2 tightly.

Please refer to FIG. 5. The circuit board 8 has a plurality of signal conductive washers 83 and a plurality of grounding components. The grounding components could be one of many styles, and in this embodiment, the grounding components are grounding conductive washers. Each signal conductive washer 83 is corresponding to one of the terminals, and each of the terminals is corresponding to one of the lines of the chip module 2. The grounding conductive washers include some direct conductive washers 81 and some indirect conductive washers 82. Each of the direct conductive washers 81 is annular, and a passing hole 810 for one of the connecting components 5 passing through is located at the center of one of the direct conductive washers 81. Each indirect conductive washer 82 is electrically connected to one of the direct conductive washers 81.

The conductive pad 7 substantially presents a shape of straw hat, and it includes a riveting part 71, a cylindrical connecting part 72, and an annular conductive part 73 coaxial to each other to form a central hole 70. The conductive part 73 has a certain thickness. The riveting part 71 is used for connecting to the assembling hole 45 of the fixing base 4 by riveting. The connecting component 5 is a screw. The insulating film 9 is located between the circuit board 8 and the metal back plate 10 to prevent the signal transmission of the circuit board 8 from the influence of the metal back plate 10, in other words, to avoid the conduction between the lines of the circuit board 8 and the metal back plate 10 to form a short circuit. The insulating film 9 and the metal back plate 10 respectively have a first through hole 90 and a second through hole 101 corresponding to the passing hole 810 to provide the connecting component 5 to pass through.

Please refer to FIG. 2 and FIG. 6. The step of assembly can be: in the first step, welding the electrical connector on the circuit board 8; in the second step, disposing the fixing base 4 of the conductive structure around the insulating main body 3, and then assembling the metal plate 1 and the stirring rod 6 on the fixing base 4, in other words, insetting the buckling parts 121 of the metal plate 1 into the buckling opening 420 of the fixing base 4, and assembling the pushing part 61 of the stirring rod 6 into curved part 410 of the fixing base 4; in the third step, disposing the conductive pad 7 between the fixing base 4 and the circuit board 8, and the connecting component 5 passing through the assembling hole 45 of the fixing base 4, the central hole 70 of the conductive pad 7, the passing hole 810 of the circuit board 8, the first through hole 90 of the insulating film 9, and the second through hole 101 of the metal back plate 10 from top to bottom.

By the operation of the stirring rod 6, the fixing base 4 and the metal plate 1 can be controlled in the open or close state. In the open state, the chip module 2 can be placed or taken off. When the electrical device 100 is in an operating state, the chip module 2 is needed to be placed therein, and the fixing base 4 and the metal plate 1 are in the close state.

Certainly, other method can be adopted besides of the above-mentioned method for assembling the electrical device 100.

As described above, the electrical device 100 can be assembled, as shown in FIG. 1 and FIG. 7.

During operation, the stirring rod 6 is driven to make the electrical device 100 in the open state, and then the chip module 2 is placed therein, and finally, the stirring rod 6 is driven to make the electrical device 100 in the close state. The stirring rod 6 would force the metal plate 1 to press the chip module 2, so that the chip module 2 is electrically connected to the electrical connector. Because the chip module 2 has a metal casing 20, and the four sides of the metal plate 1 contact the circumference 201 of the metal casing 20. When transmitting the signal, there are two disturbance transmitting paths. One of the disturbance transmitting paths is that the disturbance is transmitted to the metal plate 1 through the metal casing 20, and then transmitted to the fixing base 4 from the metal plate 1 by the buckling part 121 inserted into the buckling opening 420 of the fixing base 4. Afterward, the disturbance is transmitted from the fixing base 4 to the connecting components 5 and the conductive pads 7, and then transmitted to the direct conductive washers 81, wherein the measure of the contacting area between the conductive pads 7 and the direct conductive washers 81 is large enough to be advantageous to transmission. Afterward, the disturbance is transmitted from the direct conductive washers 81 to the indirect conductive washers 82. The configuration of the indirect conductive washers 81 is determined by the circuit arrangement of the circuit board 8 to be advantageous to transmit the disturbance out. When the circuit arrangement needs no indirect conductive washer 82, the direct conductive washers 81 can be disposed alone. Another disturbance transmitting path is that the disturbance is transmitted to the metal plate 1 through the metal casing 20, and then from the metal plate 1 to the fixing base 4. Afterward, the disturbance is transmitted from the fixing base 4 to the connecting components 5. Afterward, the disturbance is transmitted from the connecting components 5 to the metal back plate 10. The metal casing 20, the metal plate 1, the fixing base 4, the connecting components 5, and the metal back plate 10 form an electrostatic shielding system.

In the embodiment, (1) the ground lines 221 of the chip module 2 is connected to the circumference 201 of the metal casing 20 and the circumference 201 is connected to the metal plate 1 for the convenience of conducting the disturbance out, therefore, more signal conductive lines could be disposed on the substrate 22 to improve the efficiency of the chip module 2;

(2) The conductive part 73 of the conductive pad 7 has a certain thickness to separate the fixing base 4 and the circuit board 8 to avoid the short circuit between them;

(3) The connecting component 5 not only fixes the chip module 2 on the circuit board 8 and the metal back plate 10 tightly, but also generates the effect of transmitting disturbance with the conductive pad 7 to prevent the signal transmission between the chip module 2 and the circuit board 8 from disturbance, wherein the connecting component 5 is connected to the metal back plate 10 to avoid the static disturbance. Certainly, if the electrical device 100 has an insulating back plate instead of the metal back plate 10, the disturbance of the chip module 2 could be conducted out through the circuit board 8.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A grounding structure for connecting to an opposite connecting electrical device with a metal casing, the grounding structure being assembled on a circuit board having at least one grounding component, the grounding structure comprising:
    a conductive mechanism, electrically connected to the metal casing of the opposite connecting electrical device, wherein the conductive mechanism comprises a first metal component and a second metal component cooperating with and connected to each other; and
    at least one conductive pad, disposed between the conductive mechanism and the circuit board, the conductive pad contacting the conductive mechanism and the grounding component of the circuit board;
    wherein the first metal component electrically contacts the at least one grounding component, and the second metal component electrically contacts the metal casing of the opposite connecting electrical device.

2. The grounding structure according to claim 1, further comprising at least one connecting component for fixing the conductive mechanism, the conductive pad, and the circuit board.

3. The grounding structure according to claim 2, wherein the conductive pad has a central hole, and the connecting component passes through the central hole.

4. The grounding structure according to claim 1, wherein the conductive pad has a conductive part, and the conductive part separates the conductive mechanism and the circuit board.

5. The grounding structure according to claim 1, wherein the conductive pad has a riveting part, the riveting part connects to the conductive mechanism by riveting.

6. An electrical device, comprising:
    a circuit board, having at least one grounding component;
    an electrical connector, assembled on the circuit board;
    a conductive mechanism, disposed around the electrical connector, wherein the conductive mechanism comprises a first metal component and a second metal component cooperating with and connected to each other;
    at least one conductive pad, disposed between the conductive mechanism and the circuit board, the conductive pad contacting the conductive mechanism and the grounding component of the circuit board, and
    an opposite connecting electrical device having a metal casing, wherein the first metal component electrically contacts the at least one grounding component, and the second metal component electrically contacts the metal casing of the opposite connecting electrical device.

7. The electrical device according to claim 6, wherein the grounding component comprises a direct conductive washer and an indirect conductive washer connected to each other, the conductive pad is connected to the direct conductive washer.

8. The electrical device according to claim 6, further comprising at least one connecting component and a metal back plate, the metal back plate is located on another side opposite to the side where the electrical connector is disposed of the circuit board, the connecting component fixes the conductive mechanism, the circuit board, the conductive pad, and the metal back plate, and the connecting component is electrically connected to the conductive mechanism and the metal back plate.

9. The electrical device according to claim 8, wherein the conductive pad has a central hole, the circuit board has a passing hole corresponding to the central hole, and the connecting component passes through the central hole and the passing hole.

10. The electrical device according to claim 8, further comprising an insulating film disposed between the metal back plate and the circuit board.

11. The electrical device according to claim 6, wherein the opposite connecting electrical device comprises a substrate having a plurality of lines thereon, wherein a part of the lines are grounding lines connected to the circumference of the metal casing.

12. The electrical device according to claim 6, wherein the first metal component is a metal fixing apparatus, and the second metal component is a metal plate, the metal fixing apparatus is fixed on the circuit board for fixing and cooperating with the metal plate, the metal plate is used for pressing and fixing the opposite connecting electrical device.

13. A buckle, for pressing and fixing a chip module having a metal casing on an electrical connector, the buckle being assembled on a circuit board having at least one grounding component, the buckle comprising:

a metal plate, being a first metal component for pressing the chip module, the metal plate contacting the metal casing;

a metal fixing apparatus, being a second metal component and fixed on the circuit board, the metal fixing apparatus fixing and cooperating with the metal plate, wherein the first metal component and the second metal component are cooperating with and connected to each other to form a conductive mechanism; and at least one conductive pad, disposed between the metal fixing apparatus and the circuit board, the conductive pad contacting the metal fixing apparatus and the grounding component of the circuit board;

wherein the first metal component electrically contacts the at least one grounding component, and the second metal component electrically contacts the metal casing of the opposite connecting electrical device.

14. The buckle according to claim 13, further comprising at least one connecting component for fixing the metal fixing apparatus, the conductive pad, and the circuit board.

15. The buckle according to claim 14, wherein the conductive pad has a central hole, and the connecting component passes through the central hole.

16. The buckle according to claim 13, wherein the conductive pad has a conductive part, and the conductive part separates the metal fixing apparatus and the circuit board.

17. The buckle according to claim 13, wherein the conductive pad has a riveting part, the riveting part connects to the metal fixing apparatus by riveting.

* * * * *